United States Patent
Yakabe et al.

(10) Patent No.: US 10,707,356 B2
(45) Date of Patent: Jul. 7, 2020

(54) MAGNETIC MEMORY DEVICE AND MANUFACTURING METHOD OF THE SAME

(71) Applicant: TOSHIBA MEMORY CORPORATION, Minato-ku, Tokyo (JP)

(72) Inventors: Megumi Yakabe, Kanagawa (JP); Yasushi Nakasaki, Kanagawa (JP); Tadaomi Daibou, Kanagawa (JP); Tadashi Kai, Tokyo (JP); Junichi Ito, Kanagawa (JP); Masahiro Koike, Tokyo (JP); Shogo Itai, Kanagawa (JP); Takamitsu Ishihara, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/353,126

(22) Filed: Mar. 14, 2019

(65) Prior Publication Data

US 2020/0083289 A1 Mar. 12, 2020

(30) Foreign Application Priority Data

Sep. 10, 2018 (JP) .................................. 2018-168863

(51) Int. Cl.
*H01L 29/82* (2006.01)
*H01L 43/12* (2006.01)
(Continued)

(52) U.S. Cl.
CPC .............. *H01L 29/82* (2013.01); *H01L 43/12* (2013.01); *H01L 43/08* (2013.01); *H01L 43/10* (2013.01)

(58) Field of Classification Search
CPC ... H01L 29/82; H01L 43/08; H01L 27/11585; H01L 43/10; H01L 43/12; H01L 43/14; H01L 27/228
See application file for complete search history.

(56) References Cited

U.S. PATENT DOCUMENTS 7,956,352 B2   6/2011   Yukawa et al.
2012/0068286 A1*  3/2012   Hosotani ............... H01L 27/228
                                                        257/421

(Continued)

FOREIGN PATENT DOCUMENTS

JP    2010205931 A    9/2010
JP      4974555 B2    7/2012
JP    2013069788 A    4/2013

OTHER PUBLICATIONS

Jonathan J. Bean, et al., "Atomic structure and electronic properties of MgO grain boundaries in tunnelling magnetoresistive devices," Scientific Reports, vol. 7, No. 45594, Apr. 4, 2017, pp. 1-9.

(Continued)

*Primary Examiner* — Changhyun Yi
(74) *Attorney, Agent, or Firm* — Holtz, Holtz & Volek PC

(57) ABSTRACT

According to one embodiment, a magnetic memory device includes a stacked structure including first and second magnetic layers having variable and fixed magnetization directions, respectively, and a nonmagnetic layer provided between the first and second magnetic layers and containing a first compound containing first cationic and anionic elements, and a predetermined-material layer provided around side surfaces of the stacked structure and containing a second compound containing second added cationic and second added anionic elements. An absolute value of a valence number (ionic valency) of the second added cationic element is less than that of the first cationic element, and an absolute value of a valence number (ionic valency) of the second added anionic element is less than that of the first anionic element.

15 Claims, 5 Drawing Sheets

(51) Int. Cl.
    *H01L 43/08*    (2006.01)
    *H01L 43/10*    (2006.01)

(56) References Cited

U.S. PATENT DOCUMENTS

2013/0069182 A1* 3/2013 Ohsawa ............... H01L 29/82
    257/421
2013/0307099 A1* 11/2013 Kitagawa ............ H01L 29/82
    257/421

OTHER PUBLICATIONS

K. P. McKenna, et al., "First-principles calculations of defects near a grain boundary in MgO," Physical Review B 79, 224116, 2009, 11 Pages.

* cited by examiner

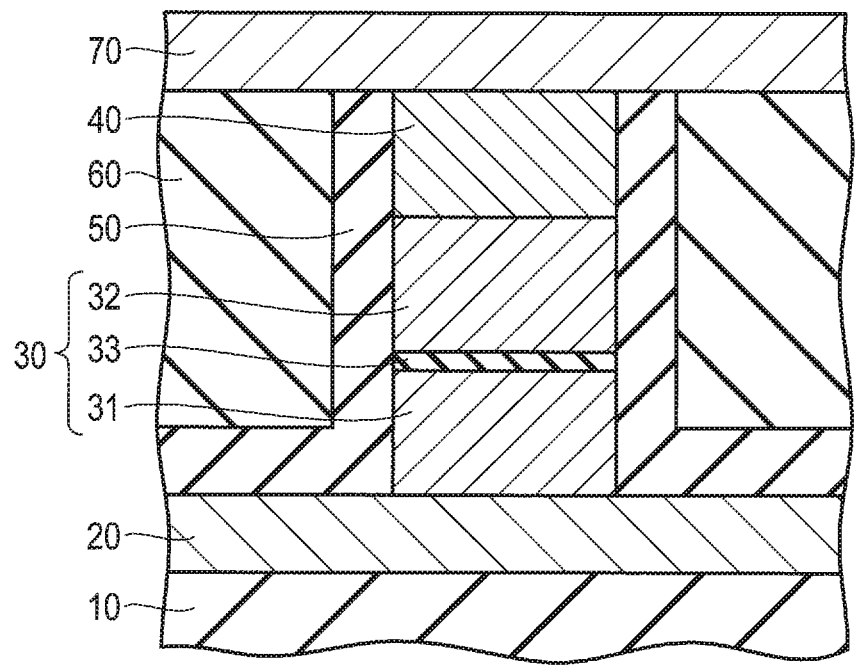
F I G. 1
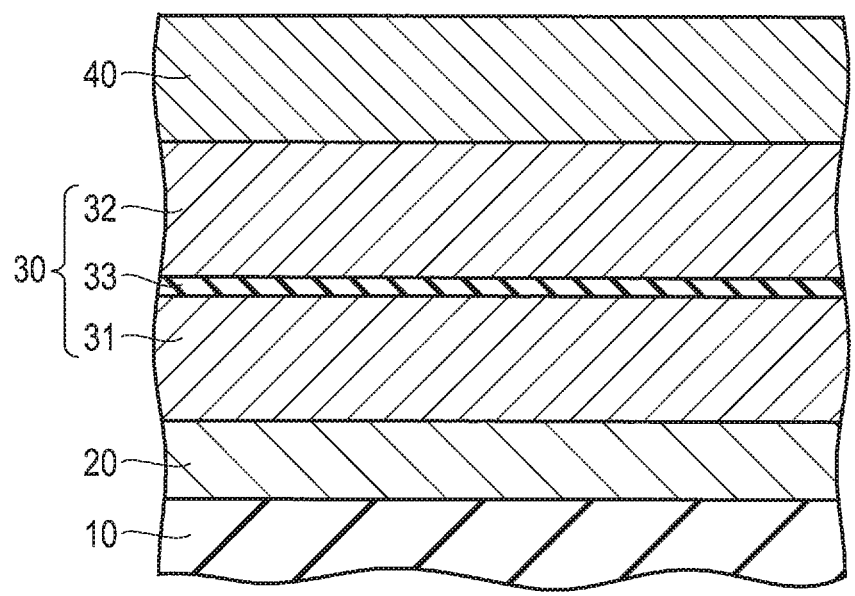
F I G. 2

MAGNETIC MEMORY DEVICE AND MANUFACTURING METHOD OF THE SAME

CROSS-REFERENCE TO RELATED APPLICATIONS

This application is based upon and claims the benefit of priority from Japanese Patent Application No. 2018-168863, filed Sep. 10, 2018, the entire contents of which are incorporated herein by reference.

FIELD

Embodiments described herein relate generally to a magnetic memory device and manufacturing method of the same.

BACKGROUND

A magnetic memory device (semiconductor integrated circuit device) in which a magnetoresistive element and transistor are integrated on a semiconductor substrate is proposed.

The above-mentioned magnetoresistive element includes a storage layer having a variable magnetization direction, a reference layer having a fixed magnetization direction, and a tunnel barrier layer provided between the storage layer and the reference layer. In order to obtain an excellent magnetoresistive element, it is important to form a tunnel barrier layer having excellent electrical, magnetic, and thermochemical characteristics.

However, heretofore, it could have hardly been said that a tunnel barrier layer having such excellent characteristics has been obtained.

BRIEF DESCRIPTION OF THE DRAWINGS

FIG. 1 is a cross-sectional view schematically showing the configuration of a magnetic memory device according to an embodiment.

FIG. 2 is a cross-sectional view schematically showing part of a manufacturing method of the magnetic memory device according to the embodiment shown in FIG. 1.

DETAILED DESCRIPTION

Figure 3:
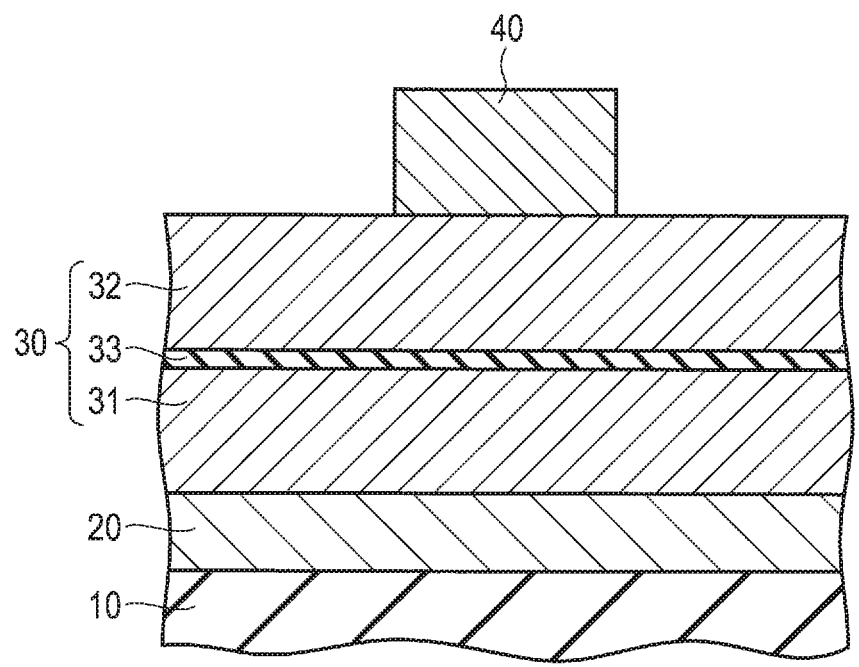
FIG. 3 is a cross-sectional view schematically showing part of the manufacturing method of the magnetic memory device according to the embodiment shown in FIG. 1.

In general, according to one embodiment, a magnetic memory device includes: an underlying area; a first magnetic layer of stacked structure provided on the underlying area, and having a variable magnetization direction; a second magnetic layer having a fixed magnetization direction; and a nonmagnetic layer provided between the first magnetic layer and the second magnetic layer and containing a first compound containing a first cationic element and a first anionic element; and a predetermined-material layer provided around side surfaces of the stacked structure and containing a second compound containing a second added cationic element and a second added anionic element, wherein an absolute value of a valence number of the second added cationic element is less than an absolute value of a valence number of the first cationic element, and an absolute value of a valence number of the second added anionic element is less than an absolute value of a valence number of the first anionic element.

Hereinafter, a valence number implies not the number of valence electrons of an element in concern but the ionic valency of the element.

Hereinafter, an embodiment will be described with reference to the accompanying drawings.

FIG. 1 is a cross-sectional view schematically showing the structure of a magnetic memory device (semiconductor integrated circuit device) according to an embodiment.

Lower interconnect 20 is provided on an underlying area 10 including a semiconductor substrate, transistor, interconnect, and the like.

A stacked structure 30 functioning as a magnetoresistive element is provided on the lower interconnect 20. The magnetoresistive element is also called a magnetic tunnel junction (MTJ) element. The stacked structure 30 includes a storage layer (first magnetic layer) 31, reference layer (second magnetic layer) 32, and tunnel barrier layer (nonmagnetic layer) 33.

The storage layer (first magnetic layer) 31 has a variable magnetization direction. That the magnetization direction is variable implies that the magnetization direction can be altered corresponding to a predetermined write current. The storage layer 31 contains therein iron (Fe) and boron (B). The storage layer 31 may further contain therein cobalt (Co) in addition to iron (Fe) and boron (B). In the present embodiment, the storage layer 31 is formed of cobalt-iron-boron alloy (CoFeB)

The reference layer (second magnetic layer) 32 has a fixed magnetization direction. That the magnetization direction is fixed implies that the magnetization direction is not be altered under the predetermined write current. The reference layer 32 is formed of a first sub-layer in contact with the tunnel barrier layer 33 and a second sub-layer provided on the first sub-layer. The first sub-layer contains therein iron (Fe) and boron (B). The first sub-layer may further contain therein cobalt (Co) in addition to iron (Fe) and boron (B). The second sub-layer contains therein cobalt (Co) and at least one element selected from platinum (Pt), nickel (Ni) and palladium (Pd). More specifically, the second sub-layer is formed of a superlattice such as Co/Pt, Co/Ni, Co/Pd or the like.

The tunnel barrier layer (nonmagnetic layer) 33 is formed of an insulating material provided between the storage layer 31 and the reference layer 32. The tunnel barrier layer 33 is formed of a first compound containing therein a first cationic element and a first anionic element. For example, a valence number of the first cationic element is "+2", divalent ion (first cationic element ion) having a divalent ion valency, and valence number of the first anionic element is "−2", divalent ion (first anionic element ion) having a divalent ion valency. More specifically, it is possible to use a combination of a group 2 element as the cation and group 16 element as the anion. In this embodiment, the first cationic element is magnesium (Mg) and first anionic element is oxygen (O). That is, the tunnel barrier layer 33 is formed of magnesium oxide (MgO).

It should be noted that the tunnel barrier layer 33 may be formed of aluminum oxide ($Al_2O_3$) the first cationic element of which is aluminum (Al) and first anionic element of which is oxygen (O). As the tunnel barrier layer 33, titanium oxide ($TiO_2$) or hafnium oxide ($HfO_2$) may also be used.

Further, the tunnel barrier layer 33 may contain therein both of magnesium (Mg) and aluminum (Al) as the first cationic elements. That is, the tunnel barrier layer 33 may also be formed of spinel ($MgAl_2O_4$) which is a mixture of magnesium oxide (MgO) and aluminum oxide ($Al_2O_3$). In this case, it is desirable that the composition ratio of MgO to $Al_2O_3$ be 1:1. Although the composition ratio of MgO to $Al_2O_3$ is not limited to 1:1, actually, it is desirable that the composition ratio be approximately 1:1. Further, the tunnel barrier layer 33 may also be formed of a mixture of hafnium oxide ($HfO_2$) and zirconium oxide ($ZrO_2$). Although the composition ratio of $HfO_2$ to $ZrO_2$ is not limited to 1:1, actually, it is desirable that the composition ratio be approximately 1:1.

A hard mask layer 40 is formed on the stacked structure 30. The hard mask layer 40 is used as a mask when the pattern of the stacked structure 30 is formed by such as ion beam etching (IBE) method.

Around the side surfaces of the stacked structure 30, side surfaces of the hard mask layer 40, and top face of the lower interconnect 20, a predetermined-material layer 50 consisting of insulating material is formed. The predetermined-material layer 50 is formed of a second compound containing therein a second added cationic element and a second added anionic element. The absolute value of the valence number of the second added cationic element is less than the absolute value of the valence number of the first cationic element, and absolute value of the valence number of the second added anionic element is less than the absolute value of the valence number of the first anionic element. For example, the valence number of the second added cationic element is "+1", monovalent ion (second added cationic element ion) having a monovalent ion valency, and valence number of the second added anionic element is "−1", monovalent ion (second added anionic element ion) having a monovalent ion valency. More specifically, it is possible to use a combination of a group 1 element as the cation and group 17 element as the anion. Further, when MgO is used as the tunnel barrier layer 33, it is possible to use a combination in which a Mg site is substituted by a monovalent cation, and an O site is substituted by a monovalent anion. Furthermore, a material in which a Mg is substituted by a monovalent cation under the presence of interstitial hydrogen may also be used. The thickness of the predetermined-material layer 50 may be typically about 1 to 2 nm or less.

In this embodiment, the second added cationic element is lithium (Li) and second added anionic element is fluorine (F). That is, the predetermined-material layer 50 is formed of lithium fluoride (LiF).

It should be noted that the predetermined-material layer 50 may also be formed of sodium fluoride (NaF) in which the second added cationic element is sodium (Na) and second added anionic element is fluorine (F). It should be noted that the doping ratio of the added cationic element ion to the added anionic element ion is preferred to keep the charge neutrality of the tunnel barrier layer 33.

Further, it is well known that an interstitial hydrogen atom is amphoteric in various substances, in other word, the atom can be charged both positively and negatively. The cases of MgO, $Al_2O_3$, $MgAl_2O_4$, $TiO_2$, $HfO_2$, and $(HfO_2)_x(ZrO_2)_{1-x}$ are no exception. Furthermore, when the substitutional site of Mg of MgO is occupied by H, the H can be charging to negative monovalent or negative divalent state and, when the substitutional site of O of MgO is occupied by H, the H can be charging to positive monovalent state. Accordingly, a material having a structure in which the Mg site in MgO is substituted by a positively monovalent H atom, and the O site in MgO is substituted by a negatively monovalent H atom may also be used as the predetermined-material layer 50. Such a case can be generalized as follows; the predetermined-material layer 50 is formed of the second added cationic element including H, second added anionic element including H, third cationic element such as Mg or the like, and third anionic element such as O or the like and, in the layer 50, the absolute value of the valence number of the second added cationic element is less than the absolute value of the valence number of the third cationic element, absolute value of the valence number of the second added anionic element is less than the absolute value of the valence number of the third anionic element, the second added cationic element substitutes for the site of the third cationic element, and the second added anionic element substitutes for the site of the third anionic element.

When aluminum oxide ($Al_2O_3$) is used as the tunnel barrier layer 33, a combination of a monovalent or divalent cationic element and monovalent anionic element or combination of a positively monovalent hydrogen atom and negatively monovalent hydrogen atom can be used as the predetermined-material layer 50. Further, when titanium oxide ($TiO_2$) or hafnium oxide ($HfO_2$) is used as the tunnel barrier layer 33, a combination of a monovalent, divalent or trivalent cationic element and monovalent anionic element or combination of a positively monovalent hydrogen atom and negatively monovalent hydrogen atom can be used as the predetermined-material layer 50. It should be noted that the doping ratio of the added substitutional cationic element ion to the added substitutional anionic element ion is preferred to keep the charge neutrality of the tunnel barrier layer 33.

Around the outer side of the stacked structure 30, an interlayer insulating film 60 is formed and, the side surfaces of the stacked structure and the like are covered with the interlayer insulating film 60. As the interlayer insulating film 60, for example, silicon dioxide film, low-k film such as SiOC or the like is used.

On the hard mask layer 40, predetermined-material layer 50, and interlayer insulating film 60, upper interconnect 70 is formed.

Next, a manufacturing method of the magnetic memory device according to this embodiment will be described below.

FIGS. 2 through 7 are cross-sectional views schematically showing the manufacturing method of the magnetic memory device according to this embodiment.

First, as shown in FIG. 2, the lower interconnect 20 is formed on the underlying area 10. Subsequently, a stacked film 30a is formed on the lower interconnect 20. That is, as the stacked film 30a, the storage layer 31, tunnel barrier layer 33, and reference layer 32 are formed in sequence.

Furthermore, the hard mask layer 40 is formed on the stacked film 30a. For the formation of the stacked film 30a and hard mask layer 40, physical vapor deposition (PVD) method such as sputter deposition can be used. Chemical vapor deposition (CVD) method or atomic layer deposition (ALD) method can also be utilized, if necessary, to reduce damages caused by the ion bombardment.

Next, as shown in FIG. 3, the hard mask layer 40 is subjected to patterning by lithography and reactive ion etching (RIE), whereby the hard mask pattern is formed.

Figure 4:
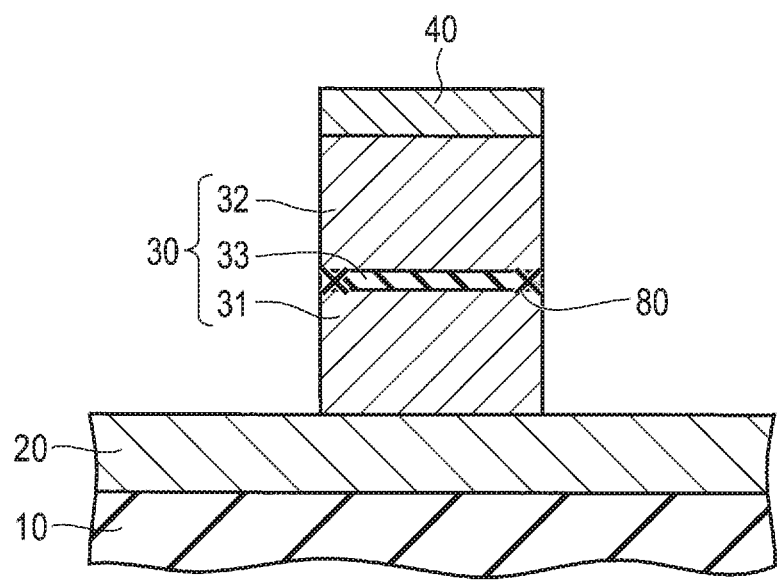
FIG. 4 is a cross-sectional view schematically showing part of the manufacturing method of the magnetic memory device according to the embodiment shown in FIG. 1.

Next, as shown in FIG. 4, the stacked film 30a is etched by using the patterned hard mask layer 40 as a mask. Ion beam etching (IBE) method is commonly used. Thereby, the stacked structure 30 is obtained. In this etching process, damages by ion bombardment and/or ion implantation are caused to the side surfaces of the tunnel barrier layer 33. As a result, grain boundaries 80 are introduced in the vicinity of the side surfaces of the tunnel barrier layer 33. Of course, grain boundaries are also introduced intrinsically during the deposition processes of the tunnel barrier layer 33.

Figure 5:
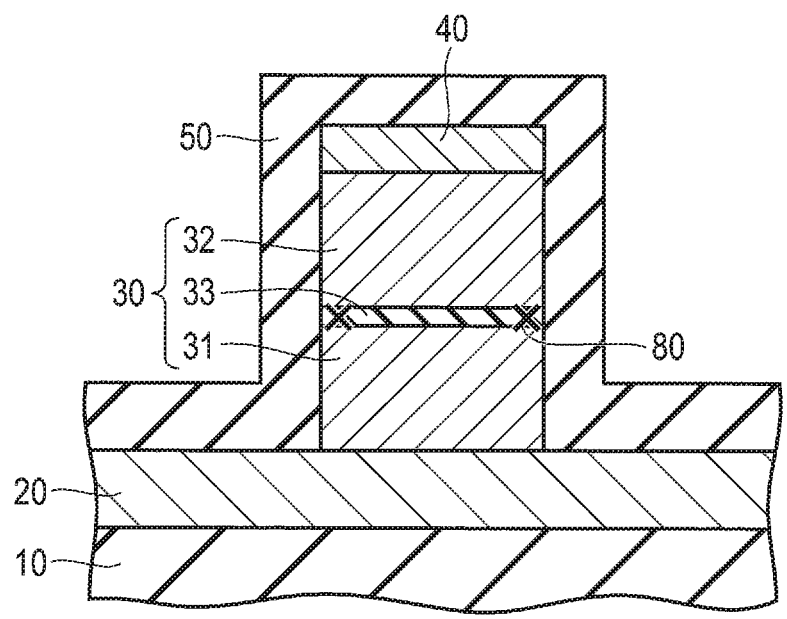
FIG. 5 is a cross-sectional view schematically showing part of the manufacturing method of the magnetic memory device according to the embodiment shown in FIG. 1.

Next, as shown in FIG. 5, the predetermined-material layer 50 covering the lower interconnect 20, stacked structure 30, and hard mask layer 40 is formed. The predetermined-material layer 50 can be formed by, for example, sputter deposition method.

Figure 6:
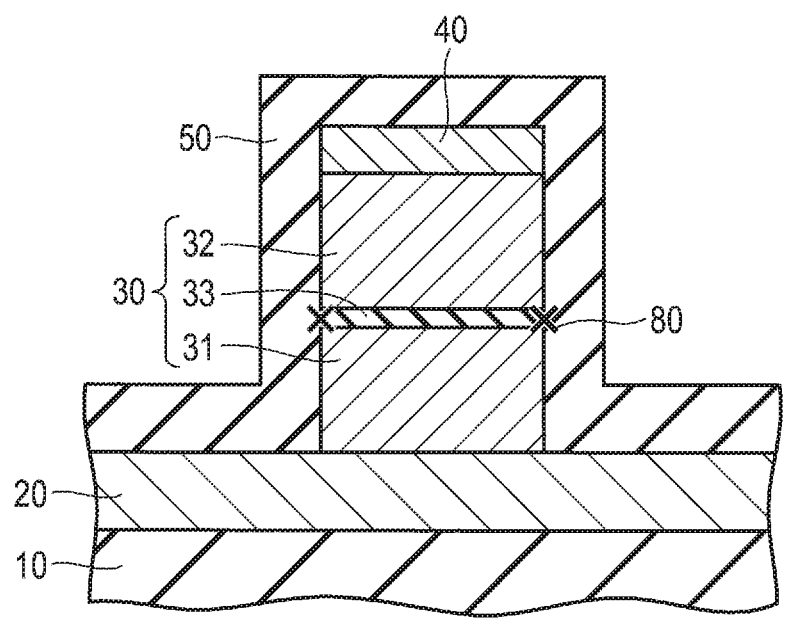
FIG. 6 is a cross-sectional view schematically showing part of the manufacturing method of the magnetic memory device according to the embodiment shown in FIG. 1.

Next, as shown in FIG. 6, the stacked structure 30 and predetermined-material layer 50 are subjected to heat treatment. It is desirable that the heat treatment temperature be higher than or equal to about 200° C. By this heat treatment, the grain boundary 80 existing in the vicinity of the side surfaces of the tunnel barrier layer 33 moves toward the outer side to the predetermined-material layer 50 interface. As already described previously, the absolute value of the valence number of the second added cationic element of the predetermined-material layer 50 is less than the absolute value of the valence number of the first cationic element of the tunnel barrier layer 33, and absolute value of the valence number of the second added anionic element of the predetermined-material layer 50 is less than the absolute value of the valence number of the first anionic element of the tunnel barrier layer 33. As a result, as described above, it is possible to make the grain boundary 80 move toward the outer side to the predetermined-material layer 50 interface due to the local dipole interaction caused by dopants and the stabilization by grain boundary and/or interface segregation of dopants. These phenomena are also confirmed by the first-principles calculations based on density functional theory.

Figure 7:
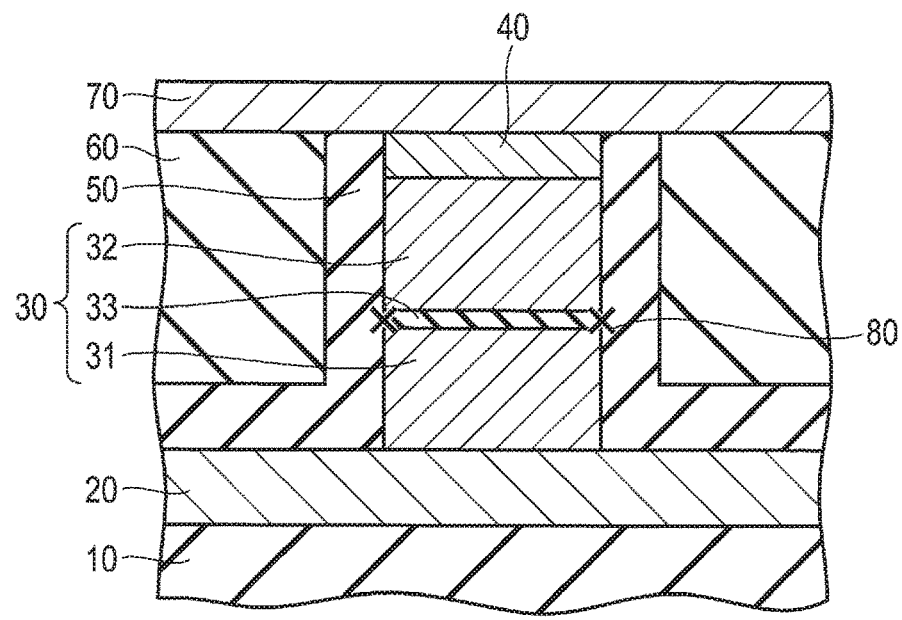
FIG. 7 is a cross-sectional view schematically showing part of the manufacturing method of the magnetic memory device according to the embodiment shown in FIG. 1.

Next, as shown in FIG. 7, the interlayer insulating film 60 is formed on the predetermined-material layer 50. Subsequently, the predetermined-material layer 50 and interlayer insulating film 60 are subjected to planarization processing. Furthermore, the upper interconnect 70 is formed on the hard mask layer 40, predetermined-material layer 50, and interlayer insulating film 60.

As described above, in this embodiment, by providing the above-mentioned predetermined-material layer 50, it is possible to make the grain boundary 80 existing in the vicinity of the side surfaces of the tunnel barrier layer 33 move toward the outer side to the predetermined-material layer 50 interface. As a result, it is possible to suppress a leakage current resulting from the grain boundary 80. Therefore, according to this embodiment, it is possible to improve the device characteristics of the tunnel barrier layer 33, and obtain an excellent magnetoresistive element.

Figure 8:
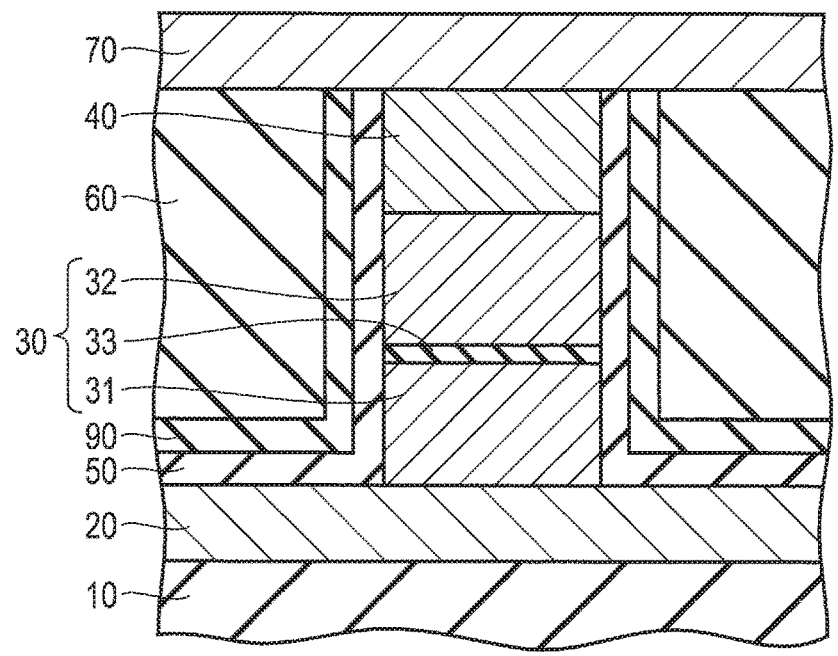
FIG. 8 is a cross-sectional view schematically showing the configuration of a magnetic memory device according to a first modification example of the embodiment.

FIG. 8 is a cross-sectional view schematically showing the configuration of a magnetic memory device (semiconductor integrated circuit device) according to a first modification example of this embodiment. In this modification example, a protective and/or blocking insulating film 90 is provided between the predetermined-material layer 50 and interlayer insulating film 60. As the protective and/or blocking insulating film 90, for example, a silicon nitride film, silicon oxynitride film or the like can be used. When the protective and/or blocking insulating film 90 is provided as described above too, advantages identical to the above-mentioned embodiment can be obtained.

Figure 9:
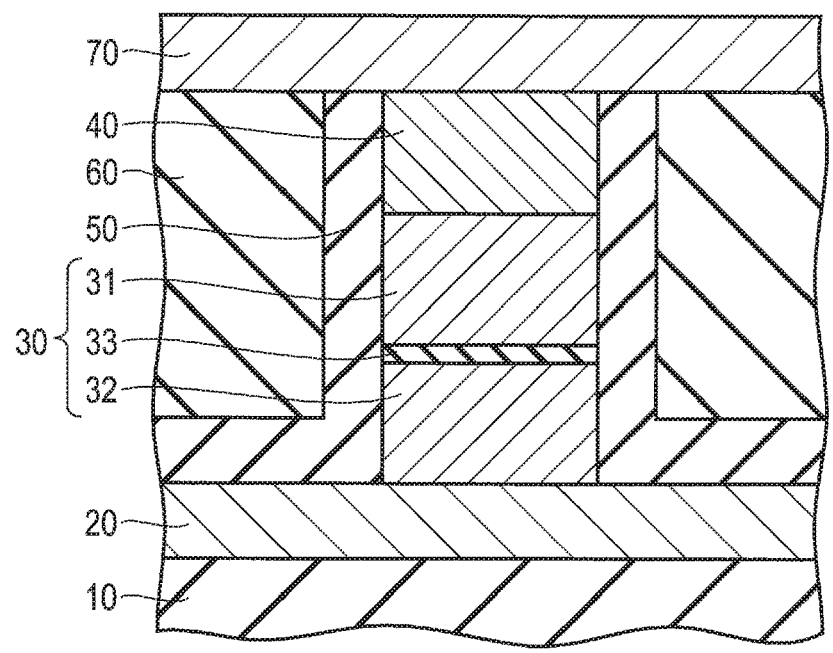
FIG. 9 is a cross-sectional view schematically showing the configuration of a magnetic memory device according to a second modification example of the embodiment.

FIG. 9 is a cross-sectional view schematically showing the configuration of a magnetic memory device (semiconductor integrated circuit device) according to a second modification example of this embodiment. In the above-mentioned embodiment, although the storage layer 31 is provided on the lower layer side of the reference layer 32, in this modification example, the storage layer 31 is provided on the upper layer side of the reference layer 32. When such a stacked configuration is employed too, advantages identical to the above-mentioned embodiment can be obtained.

Figure 10:
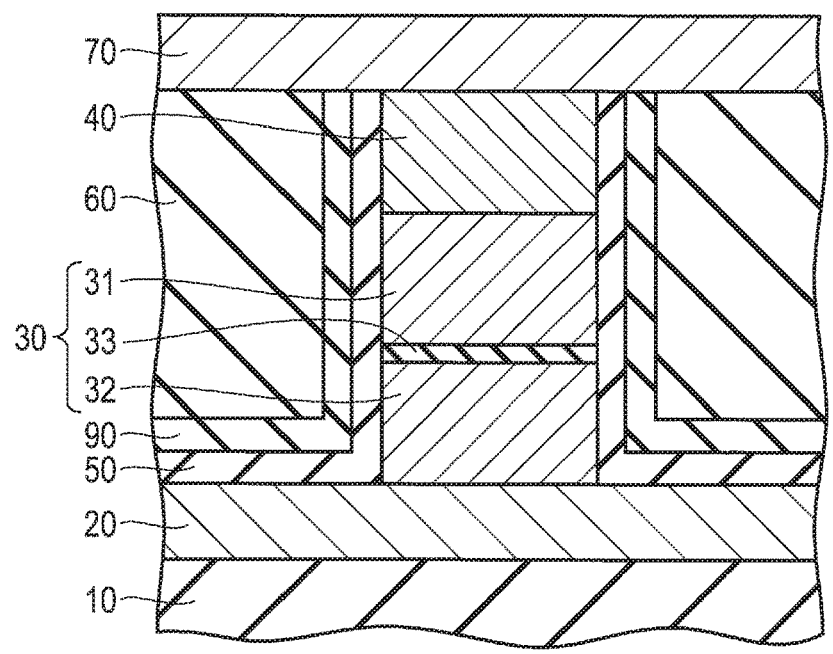
FIG. 10 is a cross-sectional view schematically showing the configuration of a magnetic memory device according to a third modification example of the embodiment.

FIG. 10 is a cross-sectional view schematically showing the configuration of a magnetic memory device (semiconductor integrated circuit device) according to a third modification example of this embodiment. In this modification example, as in the case of the second modification example, the storage layer 31 is provided on the upper layer side of the reference layer 32. Further, in this modification example, as in the case of the first modification example, a protective and/or blocking insulating film 90 is provided between the predetermined-material layer 50 and interlayer insulating film 60. When such a stacked configuration is employed too, advantages identical to the above-mentioned embodiment can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
an underlying area integrated on a semiconductor substrate;
a stacked structure provided on the underlying area and including a first magnetic layer having a variable magnetization direction, a second magnetic layer having a fixed magnetization direction, and a nonmagnetic layer provided between the first magnetic layer and the second magnetic layer and containing a first compound containing a first cationic element and a first anionic element; and
a predetermined-material layer provided around side surfaces of the stacked structure and containing a second compound containing a second added cationic element and a second added anionic element, wherein
an absolute value of a valence number of the second added cationic element is less than an absolute value of a valence number of the first cationic element, and an absolute value of a valence number of the second added anionic element is less than an absolute value of a valence number of the first anionic element.

2. The magnetic memory device of claim 1, wherein
the valence number of the first cationic element is "+2" and the valence number of the first anionic element is "−2".

3. The magnetic memory device of claim 1, wherein
the first cation is a divalent ion of magnesium (Mg) and the first anion is a divalent ion of oxygen (O).

4. The magnetic memory device of claim 1, wherein
the first cation is a trivalent ion of aluminum (Al) and the first anion is a divalent ion of oxygen (O).

5. The magnetic memory device of claim 1, wherein
the valence number of the second added cationic element is "+1" and the valence number of the second added anionic element is "−1".

6. The magnetic memory device of claim 1, wherein
the second compound is formed of the second added cationic element and the second added anionic element.

7. The magnetic memory device of claim 6, wherein
the second added cationic element is lithium (Li) and the second added anionic element is fluorine (F).

8. The magnetic memory device of claim 6, wherein
the second added cationic element is sodium (Na) and the second added anionic element is fluorine (F).

9. The magnetic memory device of claim 1, wherein
the second compound is formed of the second added cationic element, the second added anionic element, a third cationic element, and a third anionic element,
the absolute value of the valence number of the second added cationic element is less than an absolute value of a valence number of the third cationic element, and the absolute value of the valence number of the second added anionic element is less than an absolute value of a valence number of the third anionic element, and
the second added cationic element substitutes for a site of the third cationic element and the second added anionic element substitutes for a site of the third anionic element.

10. The magnetic memory device of claim 9, wherein
the second added cationic element is hydrogen (H) and the second added anionic element is hydrogen (H).

11. The magnetic memory device of claim 1, wherein
the predetermined-material layer is also provided on the underlying area.

12. The magnetic memory device of claim 1, further comprising an insulating layer provided on the predetermined-material layer.

13. A manufacturing method of a magnetic memory device, comprising:
    forming, on a underlying area, a stacked structure including a first magnetic layer having a variable magnetization direction, a second magnetic layer having a fixed magnetization direction, and a nonmagnetic layer provided between the first magnetic layer and the second magnetic layer and containing a first compound containing a first cationic element and a first anionic element; and
    forming, around side surfaces of the stacked structure, a predetermined-material layer containing a second compound containing a second added cationic element and a second added anionic element, wherein
    an absolute value of a valence number of the second added cationic element is less than an absolute value of a valence number of the first cationic element, and an absolute value of a valence number of the second added anionic element is less than an absolute value of a valence number of the first anionic element.

14. The method of claim 13, wherein
the second compound is formed of the second added cationic element and the second added anionic element.

15. The method of claim 13, wherein
the second compound is formed of the second added cationic element, the second added anionic element, a third cationic element, and a third anionic element,
the absolute value of the valence number of the second added cationic element is less than an absolute value of a valence number of the third cationic element, and the absolute value of the valence number of the second added anionic element is less than an absolute value of a valence number of the third anionic element, and
the second added cationic element substitutes for a site of the third cationic element and the second added anionic element substitutes for a site of the third anionic element.

* * * * *